(12) United States Patent
Tiemeijer

(10) Patent No.: US 11,948,771 B2
(45) Date of Patent: Apr. 2, 2024

(54) METHOD OF DETERMINING AN ENERGY WIDTH OF A CHARGED PARTICLE BEAM

(71) Applicant: FEI Company, Hillsboro, OR (US)

(72) Inventor: Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 26 days.

(21) Appl. No.: 17/523,228

(22) Filed: Nov. 10, 2021

(65) Prior Publication Data
US 2022/0148849 A1    May 12, 2022

(30) Foreign Application Priority Data

Nov. 12, 2020   (EP) .................................... 20207192

(51) Int. Cl.
*H01J 37/244*    (2006.01)
*H01J 37/09*    (2006.01)

(52) U.S. Cl.
CPC ............ *H01J 37/244* (2013.01); *H01J 37/09* (2013.01); *H01J 2237/24507* (2013.01)

(58) Field of Classification Search
CPC ..... H01J 37/244; H01J 37/09; H01J 2237/24507; H01J 37/263; H01J 2237/057; H01J 2237/065; H01J 2237/24485; H01J 2237/2802; H01J 2237/282; G01T 1/362

See application file for complete search history.

(56) References Cited

U.S. PATENT DOCUMENTS

| 4,743,756 | A | * | 5/1988 | Krivanek | ................ | H01J 49/06 250/305 |
| 4,785,172 | A | * | 11/1988 | Kubena | ................ | H01J 49/025 250/288 |
| 5,449,914 | A | * | 9/1995 | Rose | ....................... | H01J 49/46 250/305 |
| 5,798,524 | A | * | 8/1998 | Kundmann | ............. | H01J 37/05 250/311 |

(Continued)

FOREIGN PATENT DOCUMENTS

JP       2005302335       10/2005

OTHER PUBLICATIONS

EP Application No. 20207192.4, Extended European Search Report dated Apr. 15, 2021.

(Continued)

*Primary Examiner* — David A Vanore

(57) ABSTRACT

The disclosure relates to a method of determining an energy width of a charged particle beam, comprising the steps of providing a charged particle beam, directing said beam towards a specimen, and forming an energy-dispersed beam from a flux of charged particles transmitted through the specimen. As defined herein, the method comprises the steps of providing a slit element in a slit plane, and using said slit element for blocking a part of said energy-dispersed beam, as well as the step of modifying said energy-dispersed beam at the location of said slit plane in such a way that said energy dispersed beam is partially blocked at said slit element. The unblocked part of said energy-dispersed beam is imaged and an intensity gradient of said imaged energy-dispersed beam is determined, with which the energy width of the charged particle beam can be determined.

19 Claims, 8 Drawing Sheets

(56) References Cited

U.S. PATENT DOCUMENTS

| | | | | |
|---|---|---|---|---|
| 6,184,524 B1* | 2/2001 | Brink | ................... | H01J 37/265 |
| | | | | 250/311 |
| 7,067,805 B2* | 6/2006 | KajI | ...................... | H01J 37/244 |
| | | | | 250/311 |
| 9,966,219 B2* | 5/2018 | Gubbens | ................. | H01J 37/28 |
| 10,923,308 B1* | 2/2021 | Deng | ................... | H01J 37/26 |
| 2002/0096632 A1* | 7/2002 | Kaji | ...................... | H05H 1/0037 |
| | | | | 250/311 |
| 2004/0188608 A1* | 9/2004 | Kaneyama | ............ | H01J 37/265 |
| | | | | 250/311 |
| 2004/0188613 A1* | 9/2004 | Kaji | ................... | H01J 37/1471 |
| | | | | 250/311 |
| 2005/0178982 A1* | 8/2005 | Henstra | ................... | H01J 37/09 |
| | | | | 250/492.22 |
| 2006/0011836 A1* | 1/2006 | Kaji | ...................... | H01J 37/256 |
| | | | | 250/311 |
| 2010/0108883 A1* | 5/2010 | Zewail | ................... | H01J 37/26 |
| | | | | 250/307 |
| 2011/0095182 A1* | 4/2011 | Terada | ................... | H01J 37/05 |
| | | | | 250/311 |
| 2011/0240854 A1* | 10/2011 | Terada | ................... | H01J 37/05 |
| | | | | 250/311 |
| 2011/0278451 A1* | 11/2011 | Tiemeijer | ................ | H01J 37/28 |
| | | | | 250/311 |
| 2012/0049060 A1* | 3/2012 | Luecken | ................. | H01J 37/05 |
| | | | | 250/311 |
| 2015/0034824 A1* | 2/2015 | Mori | ...................... | H01J 37/05 |
| | | | | 250/310 |
| 2015/0332888 A1* | 11/2015 | Reed | ...................... | H01J 37/21 |
| | | | | 250/311 |
| 2017/0062285 A1* | 3/2017 | Ito | ........................ | H01J 37/3171 |
| 2017/0207058 A1* | 7/2017 | Gubbens | ............... | H01J 37/244 |
| 2017/0263415 A1* | 9/2017 | Bizen | ................... | H01J 37/244 |
| 2018/0301314 A1* | 10/2018 | Omoto | ................... | H01J 37/05 |
| 2019/0157035 A1* | 5/2019 | Sasaki | ..................... | H01J 37/08 |
| 2019/0244782 A1* | 8/2019 | Kawatsu | ............... | H01J 37/1474 |
| 2019/0311880 A1* | 10/2019 | Tiemeijer | ............... | H01J 37/263 |
| 2021/0140901 A1* | 5/2021 | Shin | ...................... | H01J 37/226 |
| 2021/0193448 A1* | 6/2021 | Matsuda | ............... | H01J 49/067 |
| 2021/0305013 A1* | 9/2021 | Tiemeijer | ................ | H01J 37/10 |
| 2021/0407762 A1* | 12/2021 | Tiemeijer | ............... | H01J 37/244 |
| 2023/0005733 A1* | 1/2023 | Hartong | ................. | H01J 49/46 |

OTHER PUBLICATIONS

Stöger-Pollach M et al, Advantages of low beam energies in a TEM for valence EELS, Journal of Physics: Conference Series, Institute of Physics Publishing, Bristol, GB, vol. 209, No. 1, Feb. 1, 2010, p. 12031.

* cited by examiner

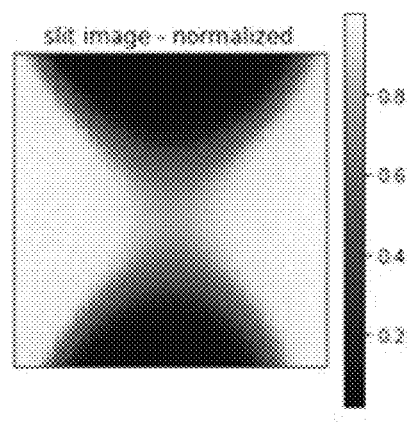
Fig. 6a
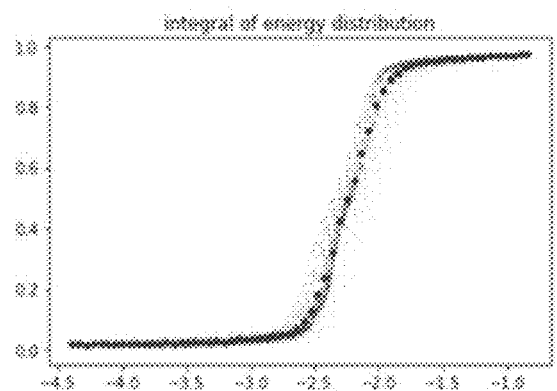 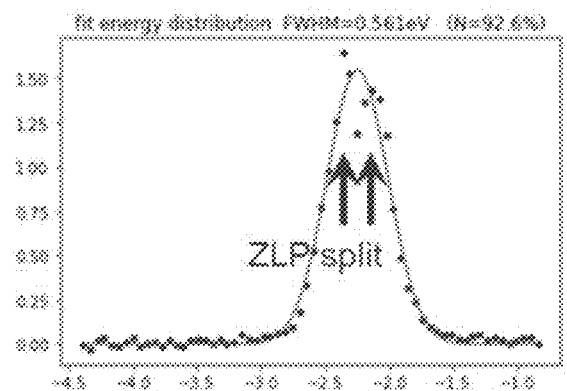
Fig. 6b      Fig. 6c
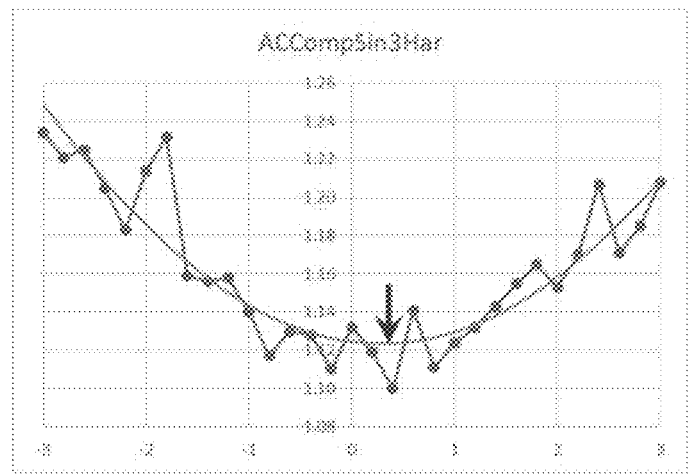
Fig. 6d

METHOD OF DETERMINING AN ENERGY WIDTH OF A CHARGED PARTICLE BEAM

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various subspecies, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

In a SEM, irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

In TEM, a beam of electrons is transmitted through a specimen to form an image from the interaction of the electrons with the sample as the beam is transmitted through the specimen. The image is then magnified and focused onto an imaging device, such as a fluorescent screen, a layer of photographic film, or a sensor such as a scintillator attached to a charge-coupled device (CCD). The scintillator converts primary electrons in the microscope to photons so that the CCD is able to detect it.

In the (S)TEM, the interaction of the electrons in the beam can be divided into elastic interactions and inelastic interactions. In elastic interactions, the primary electrons scatter on the sample and thus change direction or equivalently, their wave function changes phase, but they do not undergo a noticeable energy loss. These phase changes are used to create an image in the TEM mode (that is why TEM imaging is sometimes referred to as phase-contrast imaging). The changes of direction (or angle) are used to create an image in the STEM mode.

In inelastic interactions, the primary electrons transfer energy to electrons in the sample, for example, by exciting the electrons in the sample to higher atomic orbits, or by exciting plasmon oscillations, or by exciting bandgap transitions. If the resulting energy loss of the primary electron can be measured it can be used to one's advantage, for example, to extract information about the chemical composition or electrical properties of the sample. This is technique is known as Electron Energy-Loss Spectroscopy (EELS). EELS is typically combined with STEM to collect EELS spectra pixel by pixel.

However, inelastic interactions can also be disadvantageous, especially in TEM imaging, because the primary electrons that experienced an energy loss may not be properly focused by the TEM imaging system due to their deviating energy. Generally, the best resolution in TEM imaging is obtained for the smallest spread of energies in the primary electrons.

Because of this, modern TEMs (especially TEMs used for cryo-electron microscopy of biological samples) are often equipped with a so-called energy-filter. Such filter, which is located in or after the imaging system of the TEM, typically comprises an energy-dispersive element (for example, a bending magnet) for dispersing the primary electrons in a spectrum of electrons with different energies, an energy selecting slit for selecting and transmitting only a certain range of electron energies, optical elements for constructing (or imaging) a TEM image of those selected electrons, and a camera for recording this energy-filtered TEM image.

Such camera can be a scintillator attached to a charge-coupled device (CCD) where the scintillator converts primary electrons in the microscope to photons so that the CCD is able to detect it. Modern energy-filters often employ some type of direct-detection camera. In this type of camera, the primary electrons directly hit and enter the pixels of the sensing array (so without scintillator and the associated intermediate step of transformation to photons) and the energy that they dispose in the pixels is directly measured electronically. The advantage of such direct-detection cameras is that they are essentially noise-less, that is, they can detect every incoming primary electron without loss and with perfect precision. However, because of their direct detection, the performance of the electronics in pixels in such cameras can deteriorate due to radiation damage caused by the incoming primary electrons. This damage can occur when the total dose in one pixel exceeds about $10^{10}$ primary electrons. When such direct-detection camera is continuously recording images with 30 primary electrons per pixel per second, this limits the lifetime of such camera to about 10 years.

Energy-filtered TEM (EFTEM) is known to significantly improve the contrast in imaging of biological samples (see for example Nature, Volume 587 Issue 7832, 5 Nov. 2020).

It may be noted that usually such energy filters can also be configured to operate in the so-called 'EELS mode'. In EELS mode, the spectrum of electrons generated by the energy-dispersive element is not filtered and 'fanned-out' to construct a TEM image (as in EFTEM mode), but instead the spectrum is magnified and imaged on a spectrum detector. This spectrum detector may be the same camera that is used for recording the EFTEM image in EFTEM mode, or it can be a dedicated spectrum detector optimized, for example, for large dynamic range and/or for fast read-out and/or for low-noise. Such energy filter operated in the EELS mode can be referred to as an EELS spectrometer.

The elastic interactions are often the dominant type of interactions in TEM imaging. Thus the distributions of energies in the electron beam after the sample is dominated by the so-called zero-loss electrons or 'zero-loss peak' (ZLP), and the best spatial resolution in the TEM can be obtained when the energy spread in this zero-loss peak is as small as possible. Thus the attainable spatial resolution is limited by the energy spread in the zero-loss peak.

The width of this zero-loss peak can mainly be attributed to the effect that the source of primary electrons, the electron gun, has its own intrinsic energy spread. This energy spread $\Delta E$ is dependent on the type of electron gun but is practically in the order of 0.3-1 eV. It is customary to define the energy spread in TEM imaging or the energy resolution in EELS experiments as the full-width at half-maximum of the zero-loss peak. Various factors can affect this energy spread. For example, the energy spread of electrons emitted by a field emitter gun depends on the operating temperature of the emitter, the electric extraction field applied to this emitter, and the radius of the apex of the emitter (which may gradually change during its life time). Another example is the energy spread of the electrons of a monochromized electron gun. Here the spread depends (among others) on the excitation of the monochromator, the width of the monochromator slit, and the tuning of possible aberrations of the monochromator. In order to obtain and maintain the best spatial resolution in TEM imaging it is therefore desirable to be able to precisely measure and monitor the energy spread of the zero-loss peak.

Conventionally, the energy width $\Delta E$ is measured in EELS mode. In this mode, the optics of the energy filter is set such that the spectrum at the energy selecting slit is magnified and imaged on the camera or dedicated spectrum detector. This makes that the whole beam entering the energy filter is focused to a small ZLP image on the camera. Such image is typically about (height×width)=(20×10) pixels on the camera. If the beam entering the energy filter has 0.1 nA, then the current density in the ZLP image is 0.5 pA/pixel or 3,000,000 electrons/pixel/s. This current density is very high for a direct-detection camera, and thus dedicated detector equipment is needed to be able to measure the ZLP.

There is a desire for an improved method for measuring the energy width $\Delta E$ of the zero-loss peak (ZLP). According to one aspect, the energy width is not only useful in EELS applications but can also help in non-EELS applications. The energy width may be used to optimally tune specific parts of the charged particle microscope. As an example, the charged particle microscope may comprise a monochromator that can be tuned, using knowledge of the energy width, for reducing chromatic blur, thereby increasing spatial resolution of the charged particle microscope. The energy width may additionally or alternatively be used to minimize the effect of external influences, such as stray AC fields on the microscope.

SUMMARY

With the above in mind, it is an object of the present disclosure to provide an improved method of determining an energy width of a charged particle beam. It is in particular an object of the present disclosure to provide a method of determining an energy width of a charged particle beam for use in non-EELS applications. It is desirable to be able to measure the energy width of the charged particle beam without needing to revert to EELS-dedicated equipment, such as, for example, a dedicated detector that can withstand the relatively high current densities in the ZLP image.

To this end, the disclosure provides a method as defined in claim 1. The method as defined herein relates to determining an energy width of a charged particle beam, in particular a charged particle beam of a charged particle microscope. The method as defined herein comprises the steps of providing a charged particle beam and directing said beam towards a specimen. The method further comprises the step of forming an energy-dispersed beam from a flux of charged particles transmitted through the specimen and imaging said energy-dispersed beam. Imaging may comprise the step of directing the energy-dispersed beam onto a detector or image sensor or the like.

As defined herein, the method comprises the steps of providing a slit element in a slit plane. Said slit element may be used for blocking a part of said energy-dispersed beam, as will be explained later. Said slit plane is located downstream of the dispersive element, at or close to the location where the energy-dispersed beam is formed, and upstream of the location where the energy-dispersed beam is imaged.

As defined herein, the method comprises the step of modifying said energy-dispersed beam at the location of said slit plane. Said step of modifying comprises the step of forming a shadow part of said energy-dispersed beam by partially blocking said energy-dispersed beam with said slit element, and forming an unblocked part of said energy-dispersed beam. The shadow part and the unblocked part of said energy-dispersed beam are then imaged. Thus, the energy-dispersed beam is modified in such a way that at the location of the slit plane it is possible to block only a part of the energy-dispersed beam, whilst another part of the energy-dispersed beam is able to freely move further downstream. By blocking a part of the energy-dispersed beam, a shadow part is created. At least a part of the shadow part and at least a part of the unblocked part are then imaged, using, for example, an image sensor or detector or the like.

Modifying, as defined herein, may comprise having a defocus and/or other aberration on said energy-dispersed beam at the location of said slit plane. Modifying, as defined herein, may comprise that the slit blocks the energy-dispersed beam on some part(s) of the image sensor or detector. In other words, the energy-dispersed spectrum plane may be intentionally modified, such as for example, slightly defocused from the slit plane. This means that the energy-dispersed beam is manipulated in such a way that a focus point of the energy dispersed beam is located upstream or downstream of said slit plane. Defocus may be relatively small, meaning that the slit plane may be relatively close to the slit plane. This defocus can be the same for every position in the incoming beam (round defocus), or it can be astigmatic (non-round) so different for different directions/positions in the incoming beam, or any combination of round, non-round, or higher-order aberration. However, defocusing may be done in such a way that the ZLP in the spectrum plane acts as a source of electrons, and that the slit element creates a shadow on an image plane.

The method as defined herein further comprises the step of imaging at least part of said shadow part and said unblocked part of said energy-dispersed beam. A detector or image sensor may be used for this.

As defined herein, the method further comprises the step of determining an intensity gradient of said imaged energy-dispersed beam for determining said energy width. The method may thus comprise the step of determining an intensity gradient of at least an unblocked part of said energy-dispersed beam. Said step may comprise determining an intensity gradient between the unblocked part and the blocked part (i.e. shadow part) of said energy-dispersed beam. The unblocked part of said energy-dispersed beam is imaged in the image plane. The slit element blocks at least a part of said energy-dispersed beam from being imaged in the image plane. This blocked part appears as a shadow of the slit in the image. Since the ZLP in the spectrum plane has a finite width, different parts of the ZLP in the spectrum plane will be blocked by the slit element in a somewhat different way, and the shadow of the slit will not have infinitely sharp edges. Therefore, an intensity gradient will be visible in the image across the edges of the shadow, thus from the blocked part (i.e. shadow part) towards the unblocked part of the energy-dispersed beam. This shadow and its change may be used to determine the intensity distribution (or shape) of the ZLP, and thus the energy width of the charged particle beam. Since properties of the shadow of the beam are used to determine the energy width, the method as defined herein will also be referred to as the Shadow Method.

The Shadow Method gives principally better resolution than the traditional EELS method. This is because, unlike the EELS method, the shadow method negligibly suffers from spectrum broadening due to the point-spread function of the camera. Furthermore, the shadow method is insensitive to optical aberrations.

Additionally, the Shadow Method does not require the use of relatively expensive dedicated detector equipment. Due to the defocusing, the current density at the image plane is drastically reduced in comparison to the current density that occurs during the traditional EELS method.

Thus the method as defined herein provides an improved way for determining the energy width of a charged particle beam. With this, the object as defined herein is achieved.

Advantageous embodiments are subject to the dependent claims. Some advantageous embodiments will be described below.

In an embodiment, the step of modifying said energy-dispersed beam comprises the step of providing a defocus on said energy-dispersed beam. Additionally, or alternatively, the step of modifying said energy-dispersed beam may comprise the step of providing an aberration on said energy-dispersed beam.

The step of modifying said energy-dispersed beam may be done to introduce non-isochromatism (non=not, iso=same, chroma=color). In this case, the image of the energy-dispersed beam comprises different energies across the image as the selected energy is not the same for all positions in the image.

The method may comprise the step of measuring the non-isochromaticity. In an embodiment, measuring may be done by providing a plurality of settings for the high tension, and recording which region of the camera is illuminated at which corresponding setting (i.e. offset) of the high tension. Alternatively, this measurement may be done by providing a plurality of settings for excitation of the dispersive element (for example, a plurality of currents for a bending magnet), or by providing a plurality of excitations for a deflector scanning the beam across the energy-selecting slit, or by adjusting the potential of the electron beam in the dispersive element (for example, by a plurality of voltage offsets on the electric potential inside this element), or by providing a plurality of positions for said slit elements, or by any combination of these methods.

The step of introducing and/or measuring the non-isochromaticity may be done with the slit element at a distance from the energy-dispersed beam, i.e. in a non-blocking position of the slit element with respect to the energy-dispersed beam. The method may thus comprise the step of introducing non-isochromaticity and providing a slit element in the energy-dispersed beam with non-isochromaticity thereafter. The step of measuring the non-isochromaticity may be done before the step of providing said slit element in the energy-dispersed beam with non-isochromaticity In an embodiment, said unblocked energy-dispersed beam is imaged on an image sensor. The slit element may be provided in such a way that said slit element blocks said energy dispersed beam on part of said image sensor. In other words, the slit element blocks a part of the energy-dispersed beam, and at least a part of the shadow formed by the slit element is imaged on said image sensor.

In an embodiment, said slit element comprises two adjustable (moveable) slit edges, in which one edge is adjusted to block some parts of the image on the sensor, and the other edge is adjusted to not block any part of the image on the image sensor. In another embodiment, said two edges are adjusted to both block some part of the image on the image sensor.

In an embodiment, the method comprises the step of determining an intensity gradient of the imaged energy-dispersed beam, in particular between the unblocked part and the blocked part (i.e. shadow part) of said energy-dispersed beam on the image sensor.

In an embodiment, the method comprises the steps of providing relative movement between said slit-element and said energy-dispersed beam; and Imaging a plurality of intermediate positions of said relative movement for determining said intensity gradient.

In an embodiment, the method comprises the step of tuning a parameter of a charged particle microscope, using at least one result obtained by the Shadow Method as defined herein. The tuning may relate to an AC field compensation or to a monochromator focus or stigmator. The method may comprise the step of determining a plurality of energy widths for different parameters of the charged particle microscope, and determining an optimal setting.

According to an aspect a Transmission Charged Particle Microscope (TCPM) according to claim 8 is provided. The TCPM as defined herein comprises a specimen holder for holding a specimen, a source for producing a beam of charged particles, and an illuminator for directing said beam on to said specimen. Furthermore the TCPM comprises an imaging system for receiving a flux of charged particles transmitted through the specimen and directing it onto a sensing device, wherein said imaging system comprises a Post-Column Filter (PCF) module having an entrance plane, an image plane and a slit plane between said entrance plane and said image plane, wherein said PCF module further comprises a dispersing device provided between said entrance plane and said slit plane for forming an energy-dispersed beam. The PCF module comprises a slit element at the location of said slit plane. The TCPM also comprises a controller, for controlling at least some operational aspects of the microscope.

The TCPM as defined herein is arranged for defining an energy width of said charged particle beam by executing the method according any one of the previous claims. In particular, the controller of the TCPM may be arranged and/or programmed for executing at least part of the method as defined herein. The TCPM may be arranged and/or programmes for defining the energy width, based on signals emanating from the sensing device in response to at least part of the method being executed by the TCPM.

Advantages of such a TCPM have been elucidated above with respect to the method as defined herein.

BRIEF DESCRIPTION OF THE DRAWINGS

The device and method as disclosed herein will now be elucidated in more detail on the basis of exemplary embodiments and the accompanying schematic drawings, in which:

FIG. 6a-6d shows an embodiment of tuning a setting of a charged particle microscope, using the Shadow Method as defined herein.

In the Figures, where pertinent, corresponding parts are indicated using corresponding reference symbols. It should be noted that, in general, the Figures are not to scale.

BRIEF DESCRIPTION OF THE DRAWINGS

Figure 1:
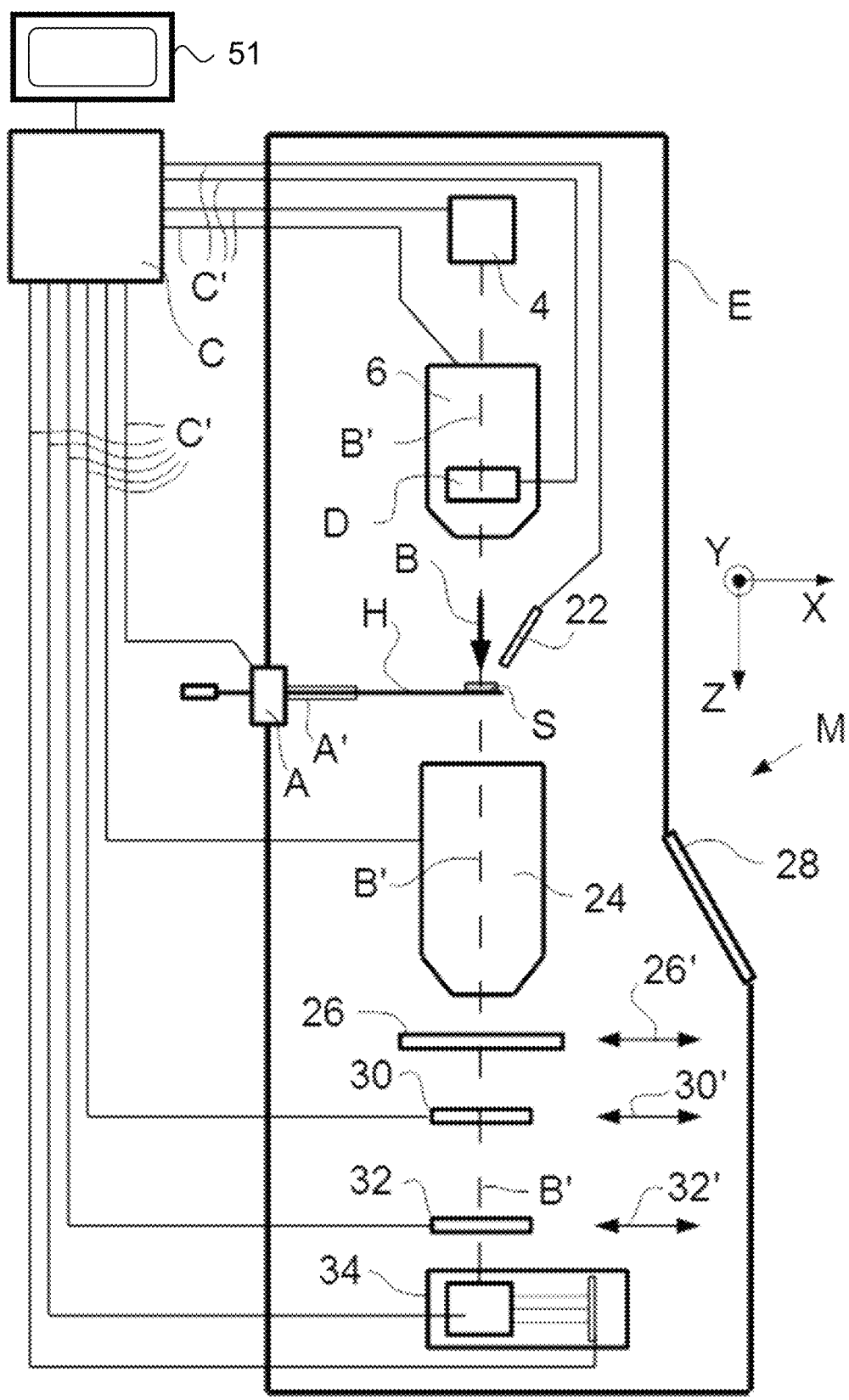
FIG. 1 shows a longitudinal cross-sectional view of a charged-particle microscope.

FIG. 1 is a highly schematic depiction of an embodiment of a transmission charged particle microscope M, which, in this case, is a TEM/STEM (though, in the context of the present disclosure, it could just as validly be an ion-based or proton microscope, for example). In FIG. 1, within a vacuum enclosure E, an electron source 4 (such as a Schottky emitter, for example) produces a beam (B) of electrons that traverse an electron-optical illuminator 6, serving to direct/focus them onto a chosen part of a sample S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The sample S is held on a sample holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the sample S to be irradiated/imaged/inspected by the electron beam traveling along axis B' (and/or allows scanning motion to be performed as an alternative to beam scanning [using deflector(s) D], and/or allows selected parts of the sample S to be machined by a (non-depicted) focused ion beam, for example).

The (focused) electron beam B traveling along axis B' will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc.

In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') so as to get it out of the way of axis B'.

STEM recorder 32. An output from recorder 32 can be recorded as a function of (X,Y) scanning position of the beam B on the sample S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS spectrometer, for example.

It should be noted that the order/location of items 30, 32 and 34 is not strict, and many possible variations are conceivable. For example, spectroscopic apparatus 34 can also be integrated into the imaging system 24.

Note that the controller (which may be a combined controller and processor) C is connected to various illustrated components via control lines (buses) C'. Controller can be connected to a computer screen 51, which may be provided with a user interface (UI). This controller C can provide a variety of functions, such as synchronizing actions, providing setpoints, processing signals, performing calculations, and displaying messages/information on a display device (not depicted). It will be understood that the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, recorder 32, spectroscopic apparatus 34, etc.

Figure 2:
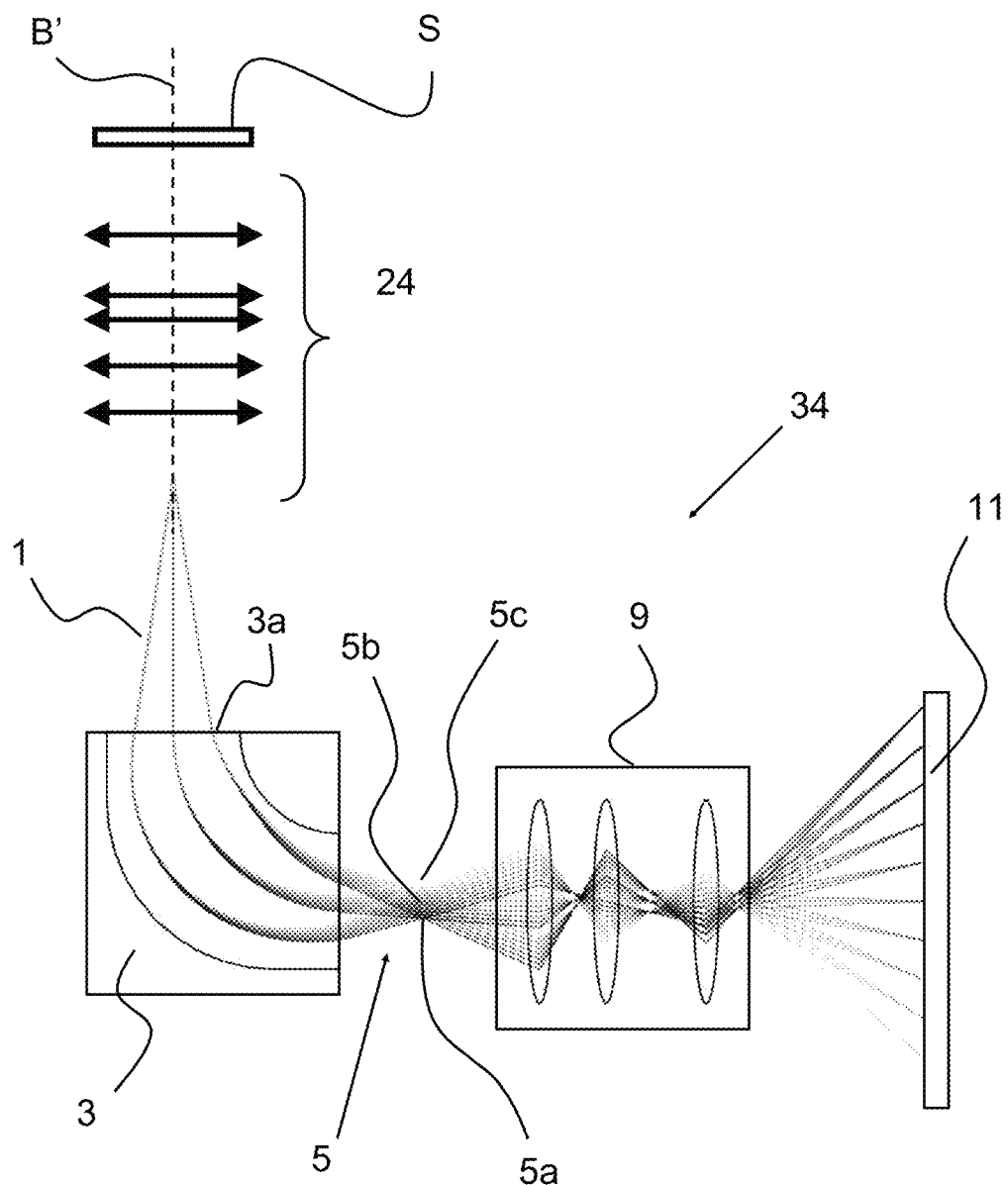
FIG. 2 shows an enlarged cross-sectional view of a spectroscopic apparatus including the projecting system.

Turning now to FIG. 2, this shows an enlarged and more detailed view of an embodiment of the spectroscopic apparatus 34 in FIG. 1 that is used for determining the energy width of a charged particle beam. Here, the spectroscopic apparatus 34 is an EELS module. In FIG. 2, a flux 1 of electrons (which has passed through sample S and imaging system 24) is shown propagating along electron-optical axis B'. This flux 1 enters a dispersing device 3 ("electron prism"), where it is dispersed (fanned out) into an energy-resolved (energy-differentiated) array 5 of spectral sub-beams, which are distributed along a dispersion direction; for illustration purposes, three of these sub-beams are labelled 5a, 5b and 5c in FIG. 3.

Downstream of the dispersing device 3, the array 5 of sub-beams encounters post-dispersion electron optics 9, where it is magnified/focused, for example, and ultimately directed/projected onto detector 11. The detector 11 may comprise an assembly of sub-detectors arranged along the dispersion direction, with different sub-detectors being adjustable so as to have different detection sensitivities. It is noted that other detector configurations for measuring EELS spectra are known to those skilled in the art.

Figure 3:
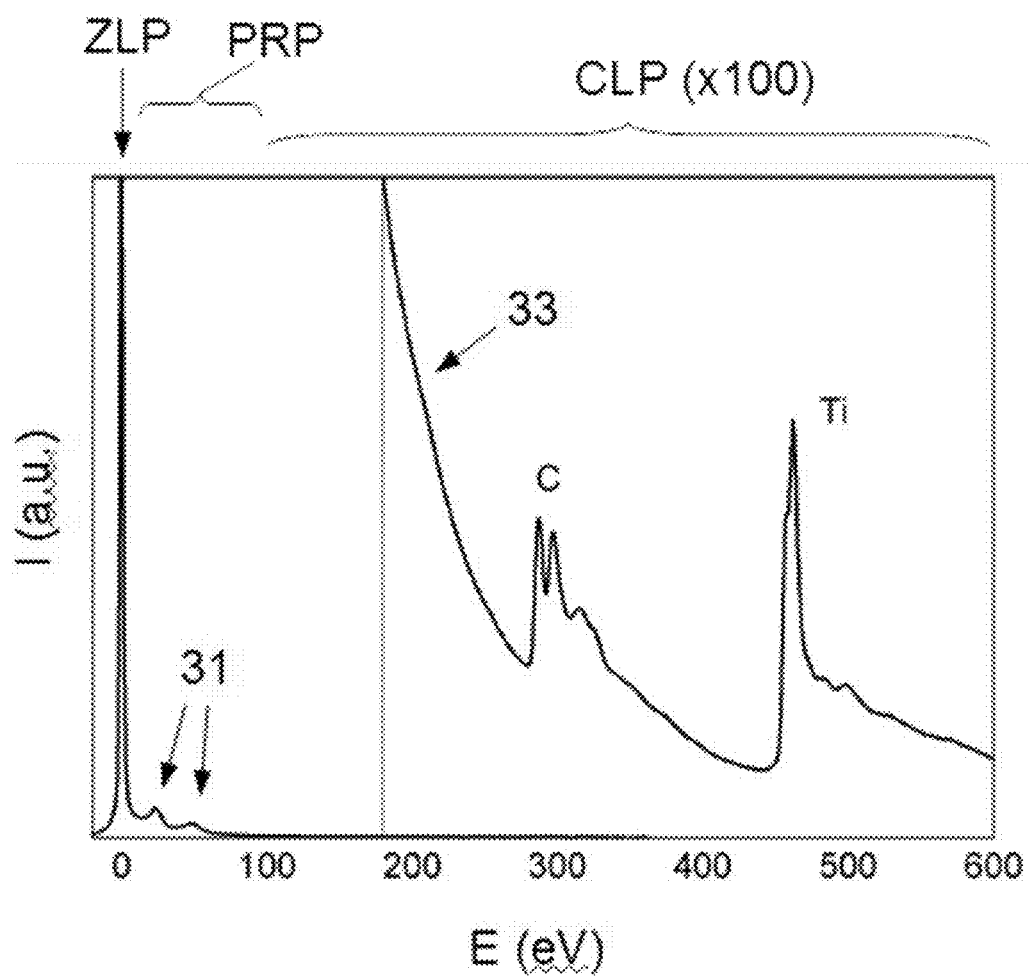
FIG. 3 shows an example of an EELS spectrum.

FIG. 3 shows an example of an EELS spectrum. The Figure renders intensity I (in arbitrary units, a.u.) as a function of energy-loss E (in eV) for electrons that have traversed a sample containing Carbon and Titanium. From left to right, the main features of the spectrum are: A Zero-Loss Peak ZLP; A Plasmon Resonance Peak component/section PRP; and A Core Loss Peak component/section CLP.

According to the prior art, the energy width ΔE of a charged particle beam is measured in EELS mode. In this mode, the optics of the energy filter is set such that the spectrum at the energy selecting slit is magnified and imaged on the camera or dedicated spectrum detector. Then, the energy width of the ZLP is measured and with this the energy width off the charged particle beam is determined.

Figure 4:
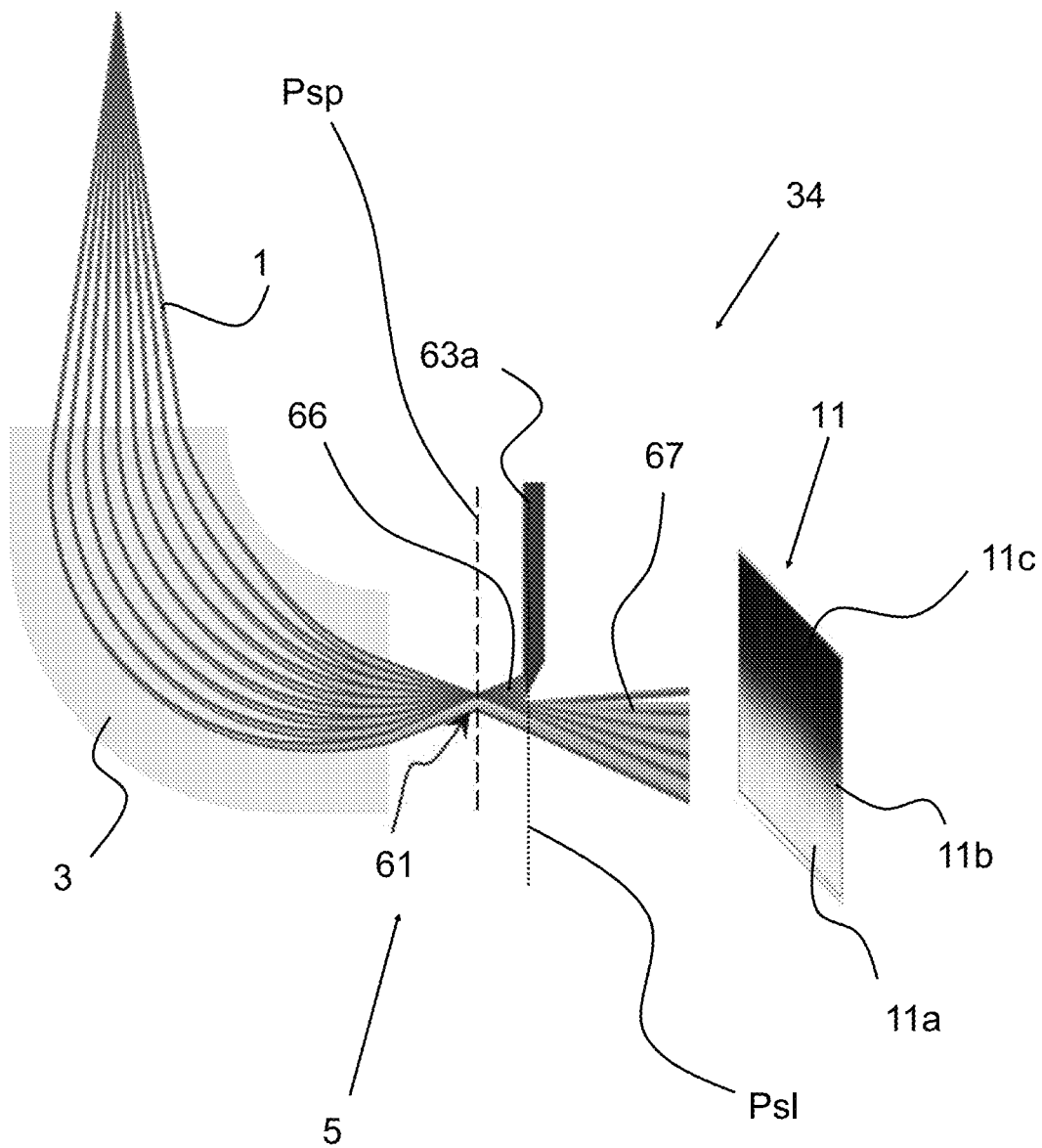
FIG. 4 shows an example of the Shadow Method as defined herein.

Now turning to FIG. 4, the basic principle of the method and device as defined herein is schematically shown. FIG. 4 shows an embodiment of spectroscopic apparatus 34, in the form of an EFTEM module. Corresponding features are indicated using the same reference signs. Here, a charged particle beam is provided and directed towards a specimen S (see FIG. 2), and an energy-dispersed beam 5 is formed from a flux 1 of charged particles transmitted through the specimen S. A slit element 63a is provided in a slit plane Psl. The energy-dispersed beam 5 is furthermore modified at the location of said slit plane Psi in such a way that said energy dispersed beam is partially blocked at said slit element 63a, or slit edge. As seen in FIG. 4, there exists a blocked part 66 of said energy-dispersed beam, and an unblocked part 67 of said energy-dispersed beam. The modification of the energy-dispersed beam is such that the energy-dispersed beam is defocused and/or aberrated at the location of the slit plane Psl. In the embodiment shown, the spectrum plane Psp is intentionally slightly defocused from the slit plane Psl. Then the ZLP in the spectrum plane Psp acts as a source of electrons, and a slit edge 63a from the slit element creates a shadow part 11c on the camera 11. Because of the finite width of the ZLP, the shadow has soft edge with a transition 11b from light 11a to dark 11c. By imaging an unblocked part 67 of said energy-dispersed beam 5, an intensity gradient 11a-11c of said imaged energy-dispersed beam can be measured and determined. In particular, the intensity across this soft shadow 11b can be measured and from that the shape of the ZLP can be calculated.

It should be noted that FIG. 4 shows a simplified sketch that does not show the imaging optics between the slit and the image sensor. These details are, however, known to those skilled in the art.

Figure 5A:
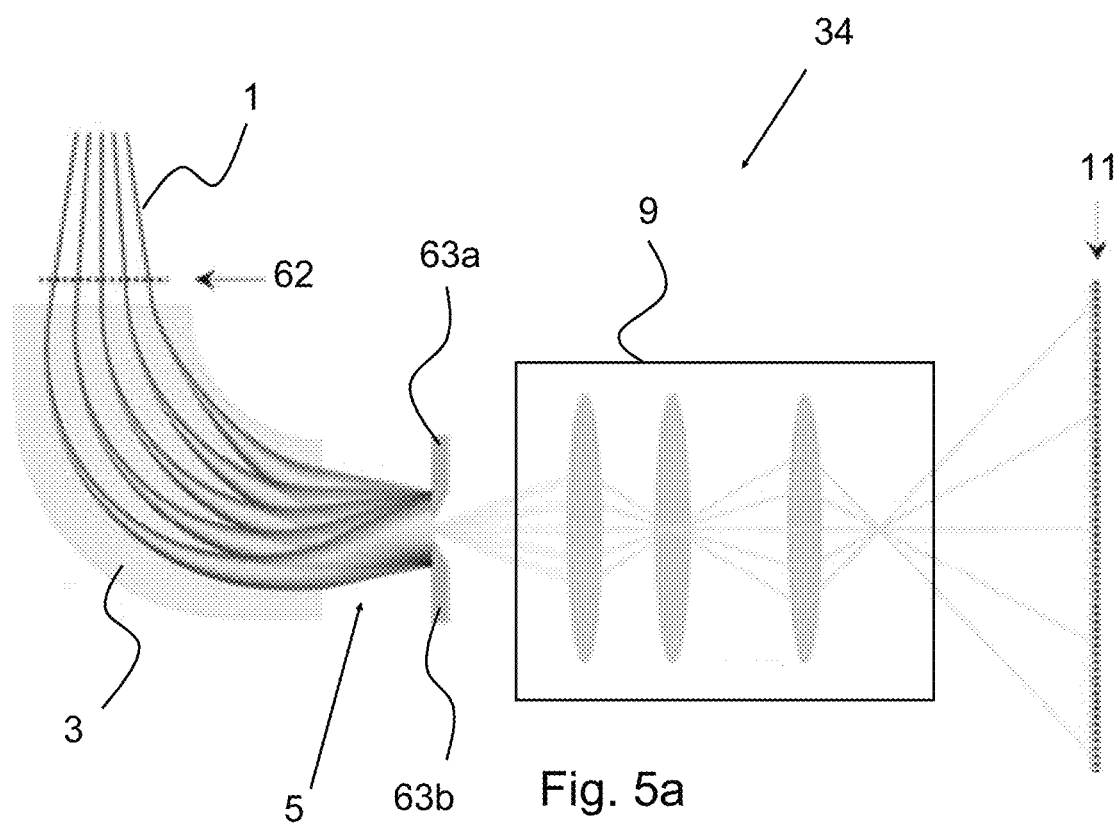
FIG. 5a-5f shows an embodiment of the Shadow Method as defined herein in more detail.
Figure 5B:
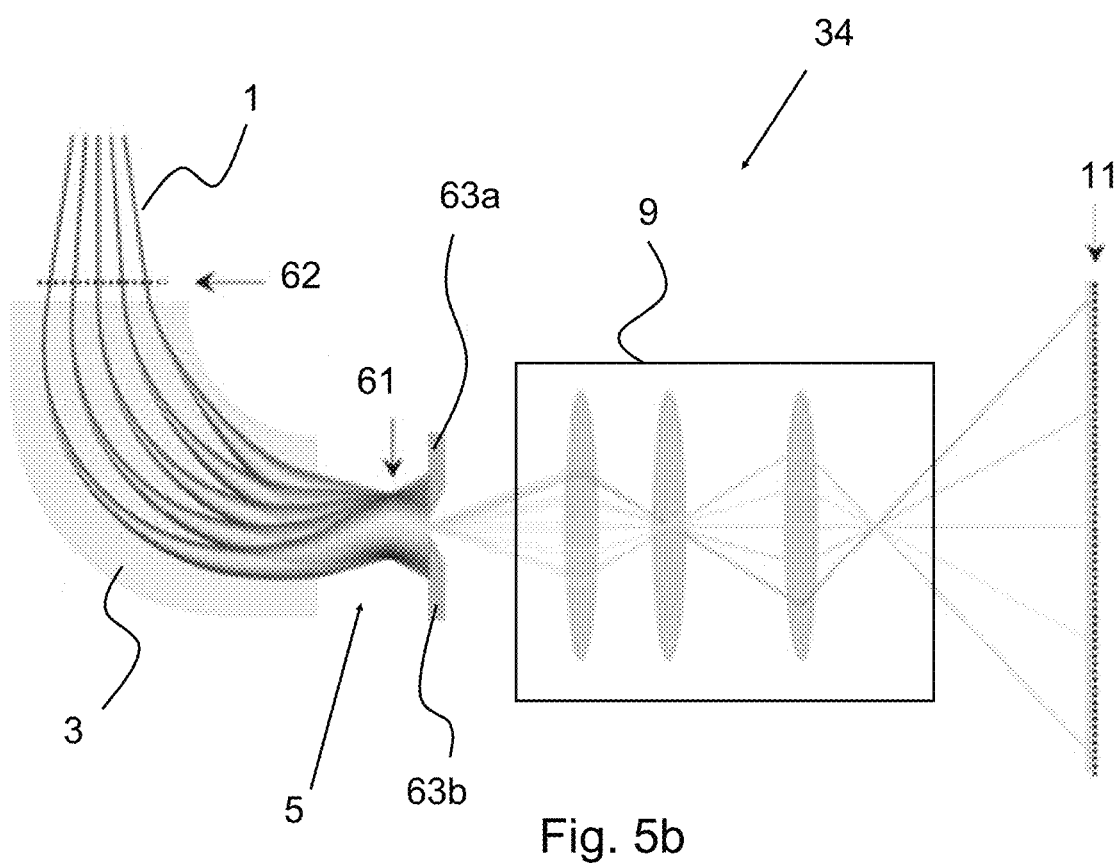

The basic principle shown in FIG. 4 will now be discussed in more detail with respect to FIG. 5a-5f. FIG. 5a shows a well-tuned filter, wherein the prism 3 in the filter forms a spectrum at the plane of the energy selecting slit 63a, 63b and the final image 11 is formed by electrons only of some specific selected energy (see FIG. 2, left). According to the method as defined herein, and as shown in FIG. 5b, the filter 3 is tuned in such a way that different energies are selected for different positions in the final image 11. Hence, the energy-dispersed beam 5 is modified in such a way that the spectrum plane is not accurately focused at the slit plane. In this case, the slit does not select a specific energy. Instead, different energies are selected for different positions in the image. The effect that the selected energy is not the same for all positions in the image is called non-isochromatism. Non-isochromaticity can be measured by scanning the high tension and recording which region of the camera is illuminated at which offset of the high tension. Alternatively, this measurement may be done by providing a plurality of settings for excitation of the dispersive element (for example, a plurality of currents for a bending magnet), or by providing a plurality of excitations for a deflector scanning the beam across the energy-selecting slit, or by adjusting the potential of the electron beam in the dispersive element (for example, by a plurality of voltage offsets on the electric potential inside this element), or by providing a plurality of positions for said slit elements, or by any combination of these methods.

Figure 5C:
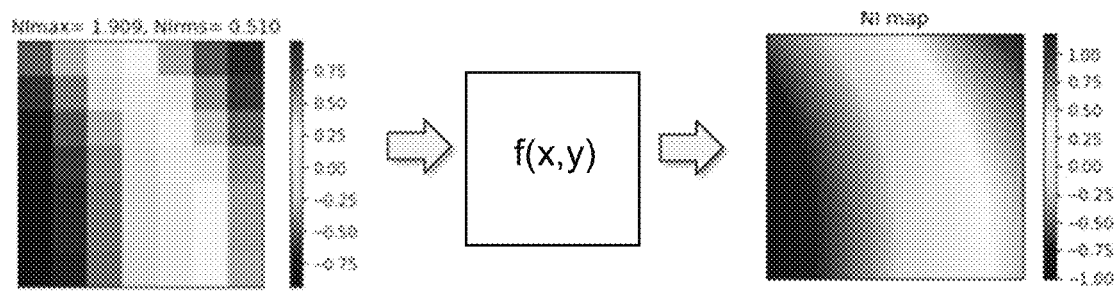

In the presently disclosed shadow method, the focus of the spectrum at the slit plane is intentionally mistuned, such that there is a few eV of non-isochromaticity across the camera, as can be seen in FIG. 5c. The method as disclosed herein may comprise the step of establishing non-isochromaticity of the energy dispersed beam. The method may comprise the step of measuring the non-isochromaticity. The method may comprise the step of fitting an equation, such as a polynomal fit, to said measured non-isochromaticity. The left image of FIG. 5c shows an example of the non-isochromaticity map as measured on 7×7 regions across the field-of-view of the camera. A polynomal fit f(x,y) can be made on this non-isochromaticity map to produce an interpolated map, as shown in the right image of FIG. 5c.

Figure 5D:
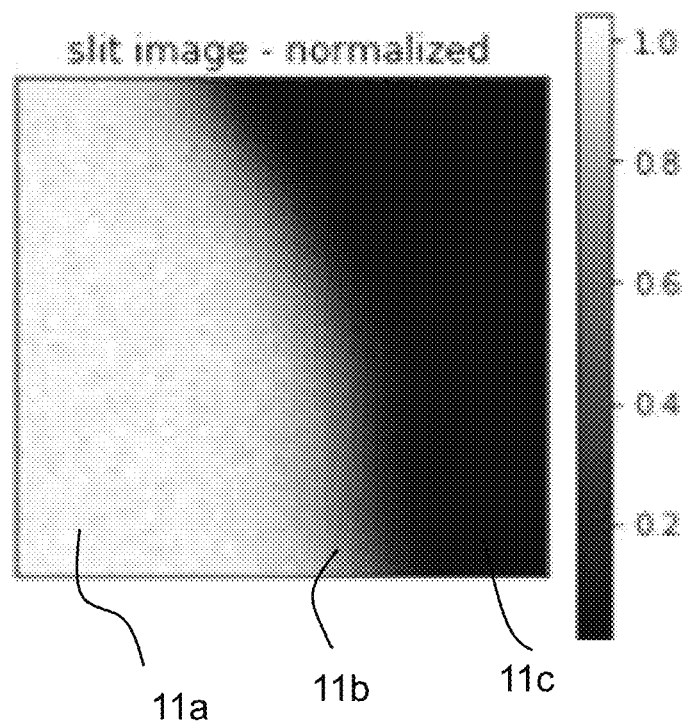

The method may comprise the step of inserting a slit element into the energy dispersed beam with established non-isochromaticity. The slit element is provided in such a way that a part of the energy-dispersed beam is blocked (forming a shadow part), and another part of the energy-dispersed beam is unblocked. The unblocked part of the energy-dispersed beam is then imaged, in such a way that the image contains the unblocked part, but also that the image contains part of the shadow part formed by said slit element being introduced into said energy-dispersed beam with established non-isochromaticity. An example image is shown in FIG. 5d. Here, the light part 11a corresponds to the unblocked part being recorded, whereas the dark part 11c (shadow part 11c) corresponds to the blocked part being blocked by the slit element and creating a shadow on the image sensor or detector.

Figure 5E:
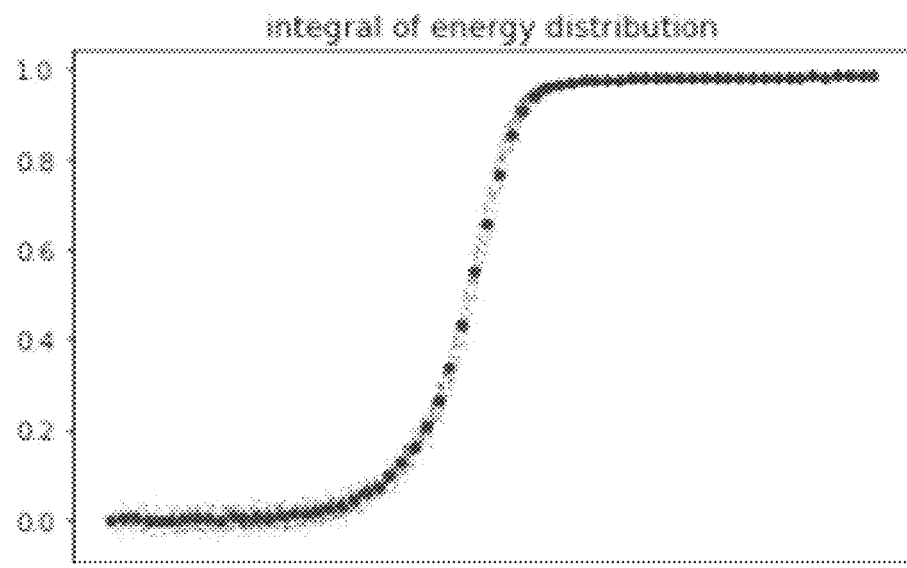
Figure 5F:
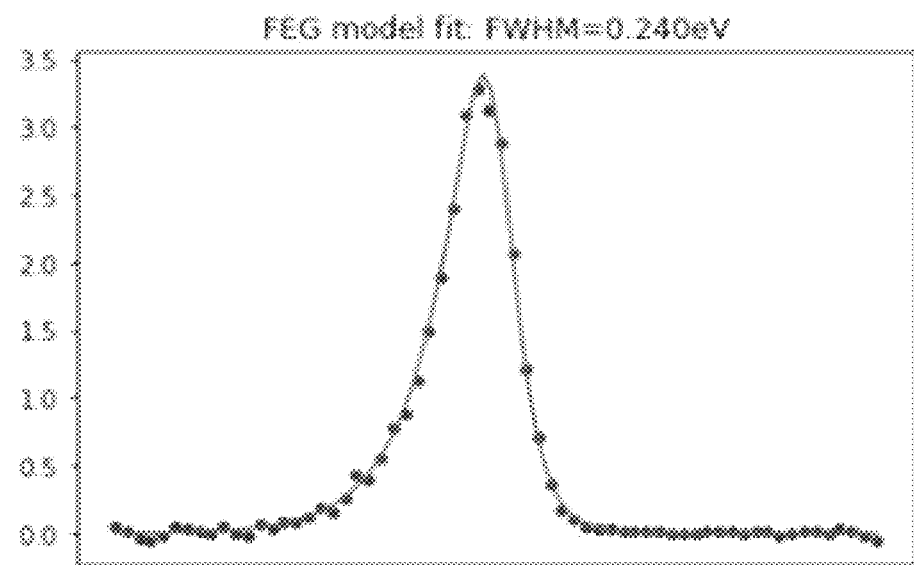

FIG. 5e plots the intensities of the pixels in FIG. 5d as function of the energies in the non-isochromaticity map in FIG. 5c. These are the grey points in FIG. 5e. Noise is reduced by collecting the points in a plurality of energy-bins, such as for example a total of 60 bins. These are the 60 black points in FIG. 5e. The black points show the integrated energy distribution $F(E)=\int_{-\infty}^{E}f(\varepsilon)d\varepsilon$ of the source. FIG. 5f shows the derivative f(E)=dF(E)/dE. This is the energy distribution. As FIG. 5f shows, this f(E) can be fit perfectly with Young's analytical expression for the energy distribution of a field emission source:

$$f(E)=J_{FN}\cdot\exp(E/d)/d/[1+\exp(-E/kT)]$$

where $J_{FN}$ is the Fowler-Nordheim current, d is a function of the extraction field, and k is Boltzmann constant. The three numbers $J_{FN}$ and d and T are used as fit parameters.

The filter 34 can compensate the effects of stray AC fields (typically occurring at 50 Hz/60 Hz and their higher order harmonics such as 150 Hz/180 Hz, etc) by applying sine/cosine-like corrections at 50 Hz/60 Hz (and 150 Hz/180 Hz, etc) to the TCPM or energy filter. These corrections can be sine/cosine-like offsets on the high tension high tension or on the excitation of the dispersive or on a deflector or on the potential of the electron beam in the dispersive element (for example, by a sine/cosine voltage offsets on the electric potential inside this element), or a combination of these. FIG. 6a-6d shows an embodiment wherein the Shadow Method is used for compensating stray AC fields.

FIG. 6a-6c shows a Shadow Method measurement of the ZLP of a monochromized FEG in the presence of a stray AC field. Without compensation, the stray AC field disturbs the electron beam and causes a splitting of the ZLP of 0.2 eV, which is clearly visible. It is noted that the applied non-isochromaticity is a saddle function in FIG. 6a, in contrast to previous figures where the applied non-isochromaticity was essentially linear. To find the optimal excitation for the AC compensation function, the following method may be applied. The AC compensation is set to several values over an interval, such as, for example −3 to +3 units, and for each setting the integral of energy distribution (FIG. 6b) and the ZLP fit (FIG. 6c) is determined. Hence, the ZLP value is measured at each value using the Shadow Method as disclosed herein. The obtained data (FIG. 6d) is then fitted with the function:

$$\Delta E_{tot} = (\Delta E_{ZLP}^2 + \Delta E_{AC}^2)^{1/2}, \Delta E_{AC} = c \cdot (ACComp - ACComp_0)$$

and the optimum compensation is at $ACComp = ACComp_0$.

In a similar way, the Shadow Method may be used for tuning a monochromator. The monochromator stigmator can be set at a range of settings, at each setting the ZLP is determined, and obtained data is fitted, in a way similar to the way how the AC compensation is tuned.

The Shadow Method gives principally better resolution than the traditional EELS method. This is because, unlike the EELS method, the shadow method negligibly suffers from spectrum broadening due to the point-spread function of the camera. Furthermore, the shadow method is insensitive to optical aberrations. For example, the shadow method gives for a CFEG FWHM=0.23 eV, whereas the EELS measurement may give FWHM=0.27 eV; the EELS measurement is 0.04 eV off due to 0.02 eV loss of resolution due to spreading of the signal in the EELS detector to neighboring pixels ('point spread') and due to another 0.02 eV loss of resolution due to aberrations in (imperfect focusing of) the energy spectrum on the EELS detector.

The shadow method can handle very low dose and it can handle very long exposure times. This is because, unlike the EELS mode, the whole camera is used. For example, with 25 pA on a direct electron detector (e.g. Falcon™ 4, Thermo Scientific™), the method works well for exposure times ranging from 0.04 s to 10 s.

It is not required to mistune the isochromaticity with an aberration which is linear in position. In principle, the shadow algorithm can handle any mistuning. Quadratic mistuning (as in FIG. 6a) has the advantage that it increases the sampling f(E) around the energy of interest (E≈0 eV).

The shadow method is preferably done using a direct electron detecting camera in counting mode, such as the Falcon™ 4. Such camera avoids artefacts that otherwise could be introduced by non-linearity or non-uniformity of the gain of the camera. Furthermore, the optimal statistics of the counting mode results in better energy resolution (nevertheless, AC tuning and monochromator tuning can also be done on a scintillator based camera, such as Thermo Scientific™ CETA-D, using the shadow method).

The shadow method works for a number of different sources, such as for example cold FEG, Schottky FEG and monochromated FEG.

Having a method to measure the energy width ΔE is not only a requirement for tuning AC compensation or for tuning the monochromator. It is also beneficial for monitoring the operation of the source (for example, to verify that emitter it operated at optimal settings for extraction field or temperature), and for trouble shooting.

The method as described herein relates to the determination of the energy distribution as obtained from the derivative of the intensity distribution across the shadow of a knife edge in front of an energy spectrum. The method can be used for tuning AC compensation in an energy filter, and/or for tuning a monochromator. The desired protection is conferred by the appended claims.

The invention claimed is:

1. A method of determining an energy width of a charged particle beam, comprising the steps of:
   providing a charged particle beam and directing said beam towards a specimen;
   forming an energy-dispersed beam from a flux of charged particles transmitted through the specimen;
   providing a slit element in a slit plane;
   modifying said energy-dispersed beam to cause the energy-dispersed beam to have a defocus at the location of said slit plane, wherein the slit element does not cause said defocus and said step of modifying comprises:
       forming a shadow part of said energy-dispersed beam by partially blocking said energy-dispersed beam with said slit element, and
       forming an unblocked part of said energy-dispersed beam;
   imaging said energy-dispersed beam, wherein the imaging comprises imaging at least part of said shadow part and said unblocked part of said energy-dispersed beam; and
   determining an intensity gradient of said imaged energy-dispersed beam for determining said energy width.

2. A method according to claim 1, wherein modifying said energy-dispersed beam comprises the step of providing a defocus on said energy-dispersed beam upstream of the location of said slit plane.

3. A method according to claim 1, wherein modifying said energy-dispersed beam comprises the step of providing a defocus on said energy-dispersed beam such that the spectrum plane is located upstream of the location of said slit plane.

4. A method according to claim 1, wherein said unblocked energy-dispersed beam is imaged on an image sensor.

5. A method according to claim 4, wherein said slit element is provided in such a way that said slit element blocks said energy dispersed beam on part of said image sensor.

6. A method according to claim 5, comprising the step of determining an intensity gradient between the unblocked part and the shadow part of said energy-dispersed beam on the image sensor.

7. A method according to claim 6, comprising the step of determining at least a first derivative of the intensity gradient for determining an energy spread function.

8. A method according to claim 1, comprising the steps of:
   providing relative movement between said slit-element and said energy-dispersed beam; and imaging a plurality of intermediate positions of said relative movement for determining said intensity gradient.

9. A method according to claim 1, comprising the step of determining a plurality of energy widths for different settings of at least one parameter of the charged particle microscope.

10. A method according to claim 9, comprising the step of determining an optimal setting for the at least one parameter.

11. A transmission Charged Particle Microscope (CPM), comprising:
a specimen holder for holding a specimen;
a source for producing a beam of charged particles;
an illuminator for directing said beam on to said specimen;
an imaging system for receiving a flux of charged particles transmitted through the specimen and directing it onto a sensing device, wherein said imaging system comprise a Post-Column Filter (PCF), the PCF comprising:
an entrance plane;
an image plane;
a slit plane between said entrance plane and said image plane;
a dispersing device provided between said entrance plane and said slit plane for forming an energy-dispersed beam from the flux of charged particles transmitted through the specimen, said energy-dispersed beam having a defocus at the slit plane; and
a slit element at the location of said slit plane, the slit element being configured to modify said energy-dispersed beam at the location of said slit plane, wherein said step of modifying comprises:
forming a shadow part of said energy-dispersed beam by partially blocking said energy-dispersed beam with said slit element, and
forming an unblocked part of said energy-dispersed beam; and
a controller, for controlling at least some operational aspects of the CPM, the operational aspects including:
imaging said energy-dispersed beam, wherein the imaging comprises imaging at least part of said shadow part and said unblocked part of said energy-dispersed beam; and
determining an intensity gradient of said imaged energy-dispersed beam for determining an energy width.

12. The CMP according to claim 11, wherein said unblocked energy-dispersed beam is imaged on the sensing device.

13. The CMP according to claim 12, wherein said slit element is provided in such a way that said slit element blocks said energy dispersed beam on part of the sensing device.

14. The CMP according to claim 13, wherein the controller is further configured to cause the CPM to determine an intensity gradient between the unblocked part and the shadow part of said energy-dispersed beam on the sensing device.

15. The CMP according to claim 14, wherein the controller is further configured to cause the CPM to determine at least a first derivative of the intensity gradient for determining an energy spread function.

16. The CMP according to claim 11, wherein the controller is further configured to cause the CPM to:
provide relative movement between said slit-element and said energy-dispersed beam; and
image a plurality of intermediate positions of said relative movement for determining said intensity gradient.

17. The CMP according to claim 11, wherein the controller is further configured to cause the CPM to determine a plurality of energy widths for different settings of at least one parameter of the charged particle microscope.

18. The CMP according to claim 17, wherein the controller is further configured to cause the CPM to determine an optimal setting for the at least one parameter.

19. The CMP according to claim 11, wherein the spectrum plane of said energy-dispersed is located upstream of the location of said slit plane.

* * * * *